United States Patent
Choi et al.

(10) Patent No.: US 6,930,330 B2
(45) Date of Patent: *Aug. 16, 2005

(54) SILICON OPTOELECTRONIC DEVICE AND LIGHT EMITTING APPARATUS USING THE SAME

(75) Inventors: Byoung-lyong Choi, Seoul (KR); Seung-ho Nam, Seongnam (KR); Eun-kyung Lee, Suwon (KR); Jae-ho You, Seoul (KR); Jun-young Kim, Gunpo (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 25 days.

This patent is subject to a terminal disclaimer.

(21) Appl. No.: 10/122,421

(22) Filed: Apr. 16, 2002

(65) Prior Publication Data

US 2003/0127655 A1 Jul. 10, 2003

(30) Foreign Application Priority Data

Jan. 10, 2002 (KR) .......................................... 2002-1431

(51) Int. Cl.[7] .............................................. H01L 33/00
(52) U.S. Cl. ........................... 257/87; 257/86; 257/461; 257/464
(58) Field of Search ............................ 257/21, 79, 80, 257/86, 87, 14, 436, 431, 461, 464, E33.015, E33.018, E33.043, E33.045, E36.011, E31.033, E31.035, 103, 22, E29.168, 101, 98, 81, 465, 462, 458, 84, 85, 13; 438/962, 555; 372/44, 47

(56) References Cited

U.S. PATENT DOCUMENTS 4,684,964 A * 8/1987 Pankove et al. .............. 257/86
5,093,576 A * 3/1992 Edmond et al. ........ 250/370.01
5,268,317 A * 12/1993 Schwalke et al. ............ 438/297
5,324,965 A * 6/1994 Tompsett et al. ........... 257/103
5,514,620 A * 5/1996 Aoki et al. .................. 438/565
5,574,744 A * 11/1996 Gaw et al. ..................... 372/50
5,583,351 A * 12/1996 Brown et al. .................. 257/89
5,607,876 A * 3/1997 Biegelsen et al. ............. 438/45
5,726,440 A * 3/1998 Kalkhoran et al. ....... 250/214.1
5,908,307 A * 6/1999 Talwar et al. ................ 438/199
5,920,078 A * 7/1999 Frey ............................. 257/14
6,297,115 B1 * 10/2001 Yu .............................. 438/305
6,566,595 B2 * 5/2003 Suzuki ........................ 136/255

FOREIGN PATENT DOCUMENTS

JP          06045645 A * 2/1994 ........... H01L/33/00

* cited by examiner

*Primary Examiner*—Tom Thomas
*Assistant Examiner*—Matthew Landau
(74) *Attorney, Agent, or Firm*—Sughrue Mion, PLLC

(57) ABSTRACT

A silicon optoelectronic device and a light-emitting apparatus using the silicon optoelectronic device are provided. The silicon optoelectronic device includes: a substrate based on an n-type or p-type silicon; a doped region formed on one surface of the substrate and doped to an ultra-shallow depth with a predetermined dopant to be an opposite type from that of the substrate to provide a photoelectrical conversion effect by quantum confinement in a p-n junction between the doped region and the substrate; and first and second electrodes formed on the substrate to be electrically connected to the doped region. The silicon optoelectronic device may further include a control layer formed on one surface of the substrate to act as a mask in forming the doped region and to limit the depth of the doped region to be ultra-shallow. The silicon optoelectronic device has excellent efficiency and can be used as either a light-emitting device or a light-receiving device. Since the optoelectronic device uses silicon as a base material, it can be manufactured at low cost.

29 Claims, 6 Drawing Sheets

SILICON OPTOELECTRONIC DEVICE AND LIGHT EMITTING APPARATUS USING THE SAME

BACKGROUND OF THE INVENTION

1. Field of the Invention

The present invention relates to silicon optoelectronic devices, and more particularly, to a low-cost, high-efficiency silicon optoelectronic device and a light emitting apparatus using the same.

2. Description of the Related Art

Silicon semiconductor substrates can be used to highly integrate logic devices, operator devices, and drive devices therein with high reliability. Because silicon is cheap, highly integrated circuits can be formed on a silicon substrate at lower cost, compared using a compound semiconductor. For this reason, silicon has been used as a base material for most integrated circuits.

Based on the advantage of silicon, steady efforts have been made to manufacture a silicon based light emitting device so as to implement a low-cost optoelectronic device that can be manufactured by the general process used to form integrated circuits. It has been experimentally confirmed that porous silicon and nano-crystal silicon have the ability to emit light. So, research on this continues.

Figure 1:
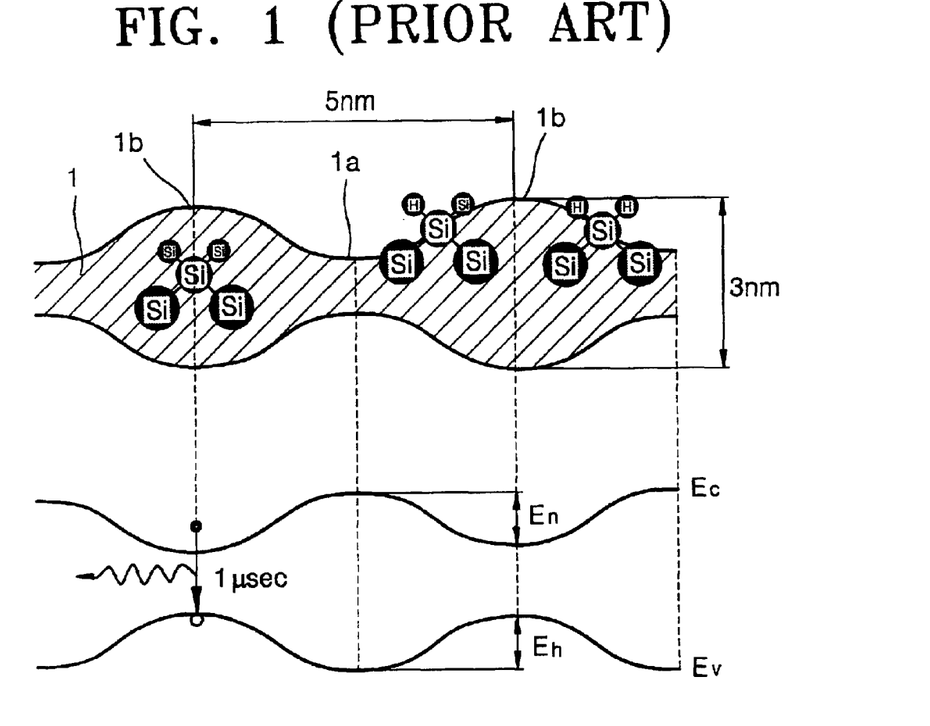
FIG. 1 shows a cross-section of a porous silicon region formed in the surface of a bulk monocrystalline silicon and the energy bandgap between the valence band and conduction band in the porous silicon region.

FIG. 1 shows a cross-section of a porous silicon region formed in the surface of a bulk monocrystalline silicon and the energy bandgap between the valence band and conduction band in the porous silicon region.

Porous silicon can be attained by anodic electrochemical dissolution on the surface of bulk monocrystalline silicon (Si) in an electrolyte solution containing, for example, a hydrofluoric (HF) acid solution.

While a bulk silicon is subjected to anodic electrochemical dissolution in an HF solution, a porous silicon region 1 having a number of pores 1a is formed in the surface of the bulk silicon, as shown in FIG. 1. In the region where the pores 1a are formed, more Si—H bonds exist than in a projection region 1b, which is not dissolved by hydrofluoric acid. The energy bandgap between the valence band (Ev) and the conduction band (Ec) appears to be inversed with respect to the shape of the porous silicon region 1.

A recession region in the energy bandgap curve, which is surrounded by projection regions and corresponds to the projection region 1b surrounded by the pore region 1a in the porous silicon region 1, provides a quantum confinement effect so that the energy bandgap in this region is increased over that of the bulk silicon. Also, in this region holes and electrons are trapped, emitting light.

For example, in the porous silicon region 1, the projection region 1b surrounded by the pore region 1a is formed as a quantum wire of monocrystalline silicon to provide the quantum confinement effect, electrons and holes are trapped by the quantum wire and coupled to emit light. The wavelengths of emitted light range from a near infrared wavelength to a blue wavelength according to the dimension (width and length) of the quantum wire. Here, the period of the porous region 1a is, for example, about 5 nm, and the porous silicon region 1 has a maximum thickness of, for example, 3 nm, as shown in FIG. 1.

Therefore, after manufacturing a porous silicon based light-emitting device, as a predetermined voltage is applied to the light-emitting device where the porous silicon region 1 is formed, a desired wavelength of light can be emitted depending on the porosity of the porous silicon region 1.

However, such a porous silicon based light-emitting device as described above is not highly reliable yet as a light-emitting device and has an external quantum efficiency (EQE) as low as 0.1%.

Figure 2:
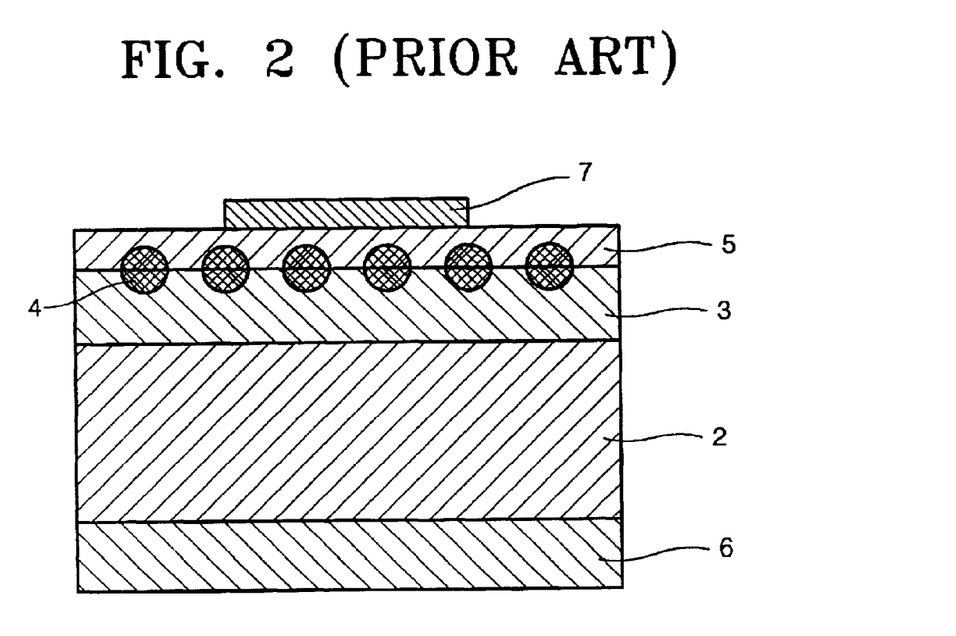
FIG. 2 is a sectional view of an example of a nano-crystal silicon-based light-emitting device.

FIG. 2 is a sectional view of an example of a nano-crystal silicon-based light-emitting device. Referring to FIG. 2, the nano-crystal silicon-based light-emitting device has a layered structure including a p-type monocystalline silicon substrate 2, an amorphous silicon layer 3 formed on the silicon substrate 2, an insulating layer 5 formed on the amorphous silicon layer 3, and lower and upper electrodes 6 and 7 formed on the bottom of the silicon substrate 2 and the top of the insulating layer 5, respectively. A nano-crystal silicon 4 is formed as a quantum dot in the amorphous silicon layer 3.

The nano-crystal silicon 4 is formed in a quantum dot form as the amorphous silicon layer 3 is rapidly heated to 700° C. in an oxygen atmosphere for recrystallization. Here, the amorphous silicon layer 3 has a thickness of 3 nm, and the nano-crystal silicon 4 has a size of about 2–3 nm.

In the light-emitting device using the nano-crystal silicon 4 described above, as a reverse bias voltage is applied across the upper and lower electrodes 7 and 6, an intensive electric field is generated at the ends of the amorphous silicon layer 3 between the silicon substrate 2 and the nano-crystal silicon 4 so that electrons and holes excited to a high-energy level are generated. The electrons and holes are tunneled into the nano-crystal silicon 4 and couple to each other therein to emit light. In the nano-crystal silicon-based light-emitting device, the wavelength of light generated therefrom becomes shorter as the size of the nano-crystal silicon quantum dot decreases.

In the light-emitting device using the nano-crystal silicon 4 described above, it is difficult to control the size and uniformity of the nano-crystal silicon quantum dot, and efficiency is very low.

SUMMARY OF THE INVENTION

To solve the above-described problems, it is an object of the present invention to provide a new silicon optoelectronic device available as a light-emitting device or a light-receiving device, which can be manufactured at low cost with higher efficiency than porous silicon-based and nano-crystal silicon-based light-emitting devices, and to provide a light-emitting apparatus using the silicon optoelectronic device.

To achieve the object of the present invention, there is provided a silicon optoelectronic device comprising: a substrate based on an n-type or p-type silicon; a doped region formed on one surface of the substrate and doped to an ultra-shallow depth with a predetermined dopant to be an opposite type from that of the substrate to provide a photo-electrical conversion effect by quantum confinement in a p-n junction between the doped region and the substrate; and first and second electrodes formed on the substrate to be electrically connected to the doped region.

It is preferable that the silicon optoelectronic device further comprising a control layer formed on one surface of the substrate to act as a mask in forming the doped region and to limit the depth of the doped region to be ultra-shallow. More preferably, the control layer is a silicon oxide layer ($SiO_2$) of an appropriate thickness such that the doped region can be formed to the ultra-shallow depth.

It is preferable that the doped region is formed by non-equilibrium diffusion of the predetermined dopant. More preferably, the predetermined dopant comprises one of boron and phosphorous.

It is preferable that at least one of quantum well, quantum dot, and quantum wire where electron-hole pairs are generated and annihilate is formed in the p-n junction between the doped region and the substrate. As a current is applied across the first and second electrodes, electron-hole pair annihilation occurs in the at least one of quantum well, quantum dot, and quantum wire to emit light, so that the silicon optoelectronic device according to the present invention is available as a light-emitting device. In this case, the silicon optoelectronic device further comprises a plurality of micro-holes in the doped region to enhance the output power of generated light. Preferably, the plurality of micro-holes extend down to a light-emitting region in the p-n junction. Preferably, the plurality of micro-holes have a size of $\lambda/(2n)$ or integer multiples of $\lambda/(2n)$, where $\lambda$ is a particular wavelength of generated light, and n is the refractive index of a medium of the micro-holes.

It is preferable that light incident through the doped region is absorbed in the at least one of quantum well, quantum dot, and quantum wire formed in the p-n junction to generate the electron-hole pairs, so that the silicon optoelectronic device is available as a light-receiving device. In this case, the at least one of quantum well, quantum dot, and quantum wire has a sub-energy bandgap large enough to enable the silicon optoelectronic device to act as a UV detector, preferably, capable of detecting the UV range no longer than 150 nm. Preferably, the first electrode is formed on one surface of the substrate where the doped region is formed, and the second electrode is formed on the other surface of the substrate. Preferably, the first and second electrodes are both formed on one surface of the substrate to be electrically connected to the doped region.

For the silicon optoelectronic device according to the present invention, the substrate is formed of one selected from the group consisting of silicon, silicon carbide, and diamond.

The present invention is also achieved by a light-emitting apparatus comprising at least one silicon optoelectronic device acting as a light-emitting device, the silicon optoelectronic device including: a substrate based on an n-type or p-type silicon; a doped region formed on one surface of the substrate and doped to an ultra-shallow depth with a predetermined dopant to be an opposite type from that of the substrate to provide a photoelectrical conversion effect by quantum confinement in a p-n junction between the doped region and the substrate; and first and second electrodes formed on the substrate to be electrically connected to the doped region.

In the light-emitting apparatus according to the present invention, it is preferable that the silicon optoelectronic device further comprises a control layer formed on one surface of the substrate to act as a mask in forming the doped region and to limit the depth of the doped region to be ultra-shallow. As a current is applied across the first and second electrodes of the silicon optoelectronic device, electron-hole pair annihilation occurs in the p-n junction between the doped region and the substrate to emit light, and the light-emitting apparatus can be used as a display system comprising a plurality of silicon optoelectronic devices arranged in a two-dimensional array. Preferably, the two-dimensional array comprises three silicon optoelectronic devices arranged in each pixel to emit light of different colors.

In the light-emitting apparatus according to the present invention, it is preferable that the three silicon optoelectronic devices emit white light, and the light-emitting apparatus comprises a dichroic color filter on the front surface of the two-dimensional array of the silicon optoelectronic devices.

As a current is applied across the first and second electrodes of the silicon optoelectronic device, electron-hole pair annihilation occurs in the p-n junction between the doped region and the substrate to emit light, and the light-emitting apparatus can be used as an illumination apparatus comprising at least one silicon optoelectronic device.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 3:
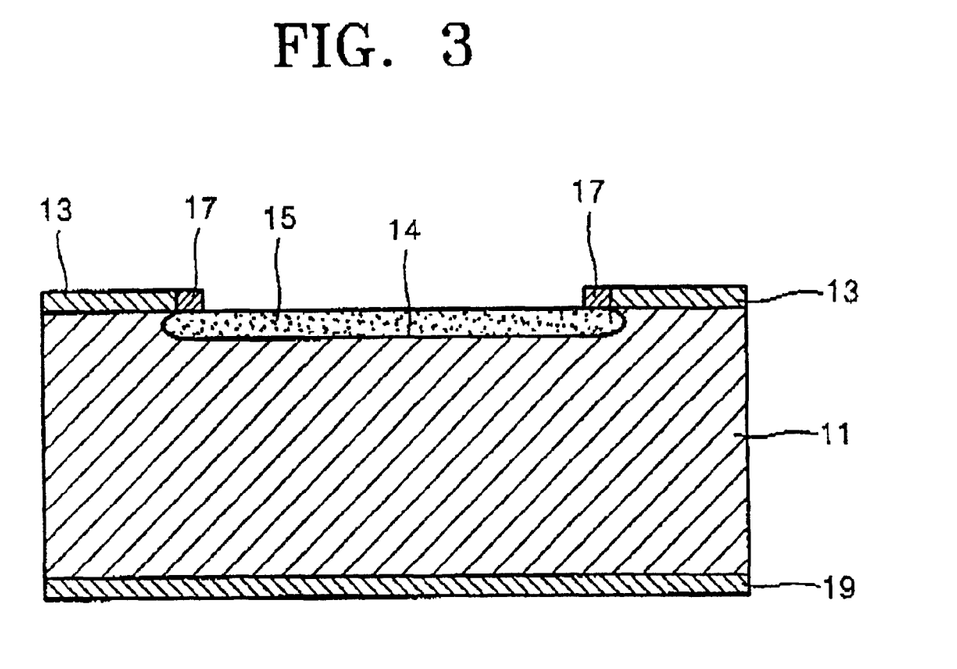
FIG. 3 is a sectional view of a silicon optoelectronic device according to the present invention.

Referring to FIG. 3, a silicon optoelectronic device according to a preferred embodiment of the present invention includes a substrate 11, a doped region 15 formed in one surface of the substrate 11, and first and second electrodes 17 and 19 formed on the substrate 11 to be electrically connected to the doped region 15. Preferably, the silicon optoelectronic device according to the present invention further comprises a control layer 13 on one surface of the substrate 11, which acts as a mask in forming the doped region 15 and enables formation of the doped region 15 to a desired ultra-shallow depth. The control layer 13 can be selectively removed after the formation of the doped region 15.

The substrate 11 is formed of a predetermined semiconductor material including silicon, for example, silicon, silicon carbide, or diamond. The substrate 11 is doped with an n-type dopant.

The doped region 15 is formed by non-equilibrium diffusion of a predetermined dopant, for example, boron or phosphorous, into the substrate 11 through an aperture in the control layer 13. The doped region 15 is doped with an opposite type to the substrate 11, for example, a p$^+$-type dopant.

In doping the doped region 15, it is preferable that the doped region 15 is doped to a desired ultra-shallow depth such that at least one of quantum well, quantum dot, and quantum wire is formed between the doped region 15 and the substrate 11, i.e., in a p-n junction 14, to provide a quantum confinement effect enabling photoelectrical conversion.

A quantum well is mostly formed in the p-n junction 14, but a quantum dot or quantum wire can be formed in the p-n junction 14. At least two of the quantum well, quantum dot, and quantum wire may be formed together in the p-n junction 14. Hereinafter, the present invention will be described as that wherein a quantum well is formed in the p-n junction 14 for the purpose of simplicity. Although the present invention is described below as that wherein a quantum well is formed in the p-n junction 14, it is appreciated that the quantum well can be regarded as at least one of a quantum well, quantum dot and quantum wire.

Figure 4A:
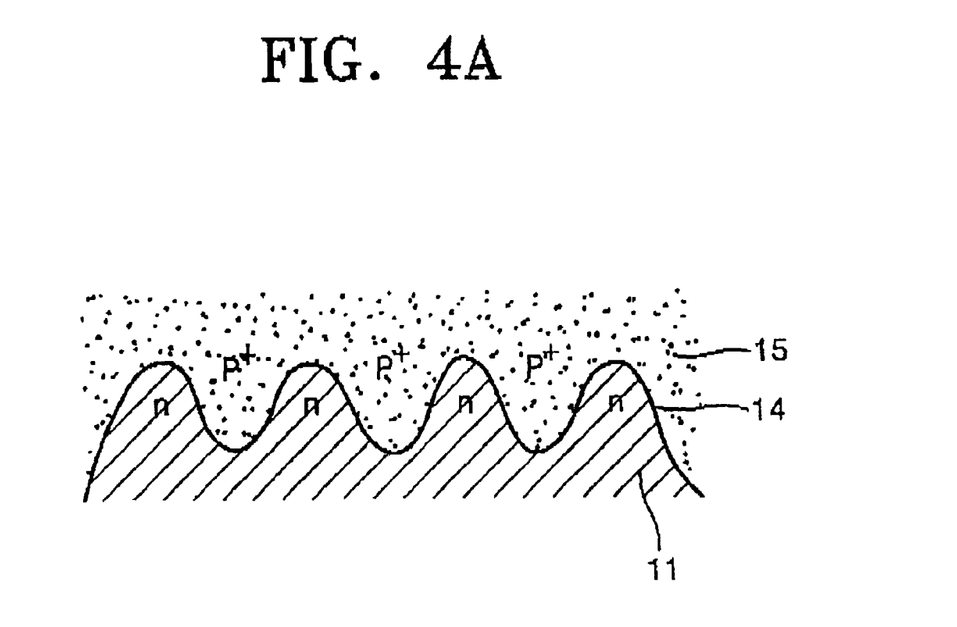
FIG. 4A shows the structure of a p-n junction as a doped layer 15 is formed to an ultra-shallow depth by non-equilibrium diffusion.
Figure 4B:
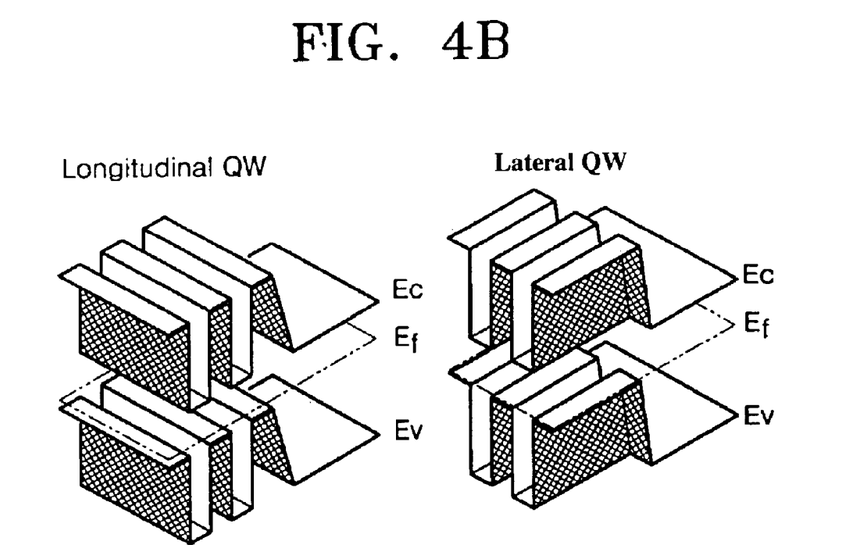
FIG. 4B shows the energy bands of longitudinal and lateral quantum wells(QW) formed in the p-n junction of FIG. 4A by non-equilibrium diffusion.

FIG. 4A shows the structure of the p-n junction 14 as the doped layer 15 is formed to an ultra-shallow depth by non-equilibrium diffusion. FIG. 4B shows the energy bands of longitudinal and lateral quantum (QW) wells formed in the p-n junction 14 of FIG. 4A by non-equilibrium diffusion. In FIG. 4B, Ec denotes the conduction band energy level, Ev denotes the valence band energy level, and Ef denotes the Fermi energy level. These energy levels are well known in the semiconductor related field, and thus descriptions thereof will be omitted here.

As shown in FIGS. 4A and 4B, near the p-n junction 14, doped layers of different dopant types are alternately formed to provide a quantum well structure. The quantum well and the underlying barrier have a depth of about 2 nm and 3 nm, respectively.

Doping the p-n junction 14 to form the quantum well to such an ultra-shallow depth can be implemented by controlling the thickness of the control layer 13 and the diffusion process conditions to be optimal.

By an appropriate diffusion temperature and the deformed potential on the surface of the substrate 11, the thickness of the diffusion profile can be adjusted to, for example, 10–20 nm, during the diffusion process. As a result, the quantum well system in such an ultra-shallow diffusion profile is formed. The surface of the substrate 11 is deformed by the thickness of the initial control layer and pre-surface treatment and the deformation becomes serious while processing.

Preferably, the control layer 13 is a silicon oxide (SiO$_2$) layer of an appropriate thickness such that the doped layer 15 can be doped to an ultra-shallow depth. As an example, to form the control layer 13, a silicon oxide layer is formed on one surface of the substrate 11, and the silicon oxide layer is etched by photolithography to remove an aperture portion for diffusion, thereby resulting in the control layer 13 having a mask structure.

As is known in the field of diffusion technology, if the thickness of the silicon oxide layer is over an appropriate thickness (thousands of angstroms) or if the diffusion temperature is low, the diffusion is affected by vacancy and results in a deep diffusion profile. In contrast, if the thickness of the silicon oxide layer is less than the appropriate thickness, or if the diffusion temperature is high, the diffusion is affected by self-interstitial of silicon and results in a deep diffusion profile. Therefore, by forming the silicon oxide layer to the appropriate thickness at which self-interstitial of silicon and vacancy are generated in a similar ratio and are coupled to each other so that diffusion of dopants cannot be facilitated, ultra-shallow doping can be achieved. Physical properties related with vacancy and self-interstitial are well known in the field of diffusion technology, and thus detailed descriptions thereof will be omitted.

Alternatively, the substrate 11 may be doped with a p-type, and the doped layer 15 may be doped with n$^+$-type.

The first electrode 17 is formed on one surface of the substrate 11 where the doped region 15 is formed, and the second electrode 19 is formed on the bottom of the substrate 11. FIG. 3 shows an example of the first electrode 17 which is formed of a non-transparent metal material, partially in contact with the edge region of the doped layer 15. The first electrode 17 may be formed to cover the entire doped region 15 using a transparent electrode material such as indium tin oxide (ITO).

In the silicon optoelectronic device according to the present invention, the quantum well where electron-hole pairs are generated and annihilate is formed in the p-n junction 14 between the doped region 15 and the substrate 11. Therefore, the silicon optoelectronic device according to the present invention can be used as a light-emitting device or a light-receiving device.

For example, as a DC voltage (or current) is applied across the first electrode 17 and the second electrode 19, carriers such as electrons and holes are injected into the quantum well in the p-n junction 14 and recombine (annihilate) due to the subband energy level in the quantum well. Here, electroluminescence of a variety of wavelengths occurs according to the state where the carriers combine.

Figure 5:
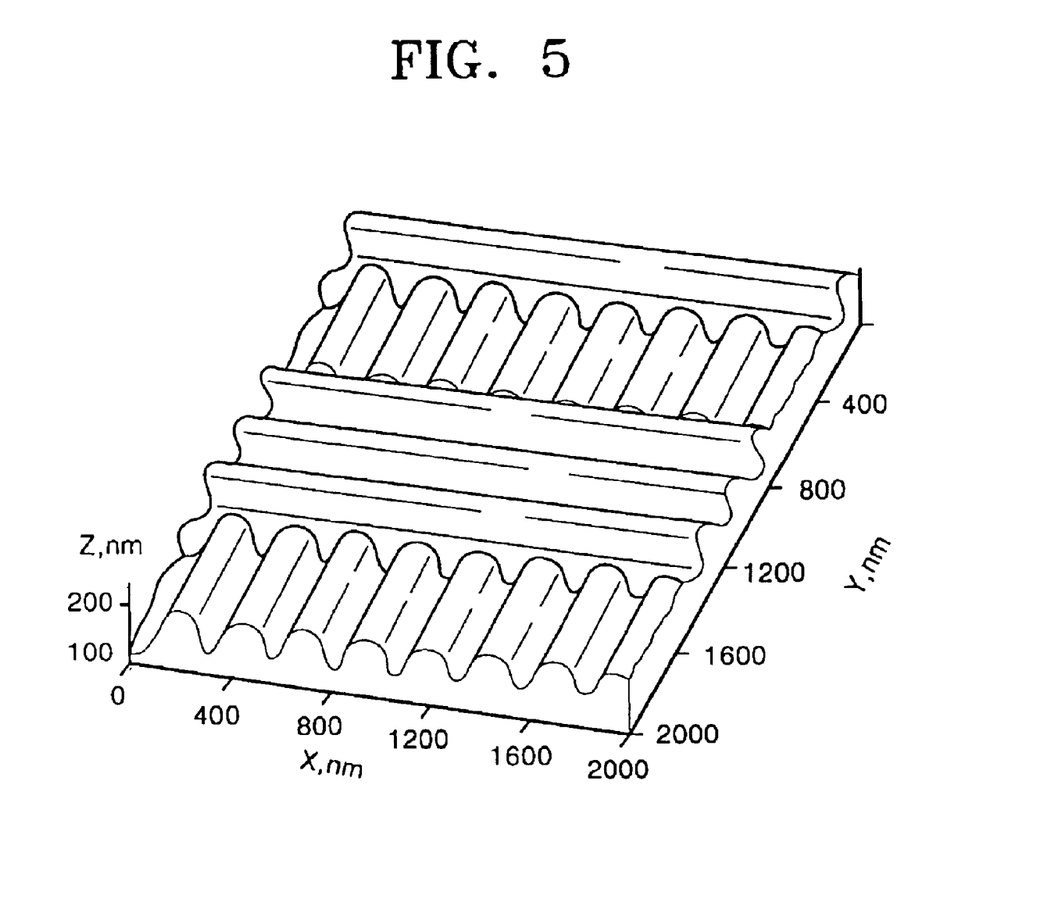
FIG. 5 shows micro-cavities formed in the surface of a substrate.

When the silicon optoelectronic device according to the present invention is used as a light-emitting device, the intensity of electroluminescence may be amplified if the wavelength of electroluminescence matches the resonance frequency of the micro-cavities resulting from micro-defects in the surface of the substrate 11 (actually, the surface of the doped layer 14). By adjusting the size of micro-cavities in the manufacture of the silicon optoelectronic device, a light-emitting device capable of emitting light ranging from a very short wavelength to a long wavelength, particularly from ultraviolet (UV) to infra red (IR) rays is obtained.

Micro-cavities occur due to the deformed potential. By adjusting the size of the micro-cavities, a particular wavelength of light or a wide wavelength range of light can be emitted.

When the silicon optoelectronic device according to the present invention is used as a light-emitting device, the light-emitting device can emit light of a wide wavelength range with a high external quantum efficiency (EQE) of about 60%.

When the silicon optoelectronic device according to the present invention is used as a light-emitting device, light emitted froth the quantum well of the ultra-shallow p-n junction diverges in every direction. When the silicon optoelectronic device according to the present invention is used as a light-emitting device, a visible range of light directed perpendicular to the surface of the device mostly emits out of the device through micro-defects formed in the surface. Meanwhile, most of the light passing in other directions is absorbed near the internal light-emitting portion of the device, i.e., at the substrate 11, and thus it cannot contribute to enhancing light-emitting efficiency.

This is because silicon of the substrate 11 has a high absorbency to the light of visible range. The absorption coefficient (α) of silicon is in the range of 3000–50000/cm to a visible light and is in the range of 5000–30000/cm to a 400–650 nm light. Supposing that silicon has an absorption coefficient (α) of 2000/cm, the intensity I of the light after passing a distance x in the silicon is given by formula (1) below, where $I_o$ denotes the initial intensity of the light:

$$I=I_o e^{(-\alpha x)} \quad (1)$$

According to formula (1) above, the light absorbency after the light travels 20 rim, is far less than 1%. Considering that the doped region 15 has a thickness of 20–30 nm, the light directed perpendicular to the surface of the device can be emitted above 99.9%. Meanwhile, light travels a relatively longer distance in other directions, so that a considerable amount of light is absorbed by the substrate 11.

Figure 6:
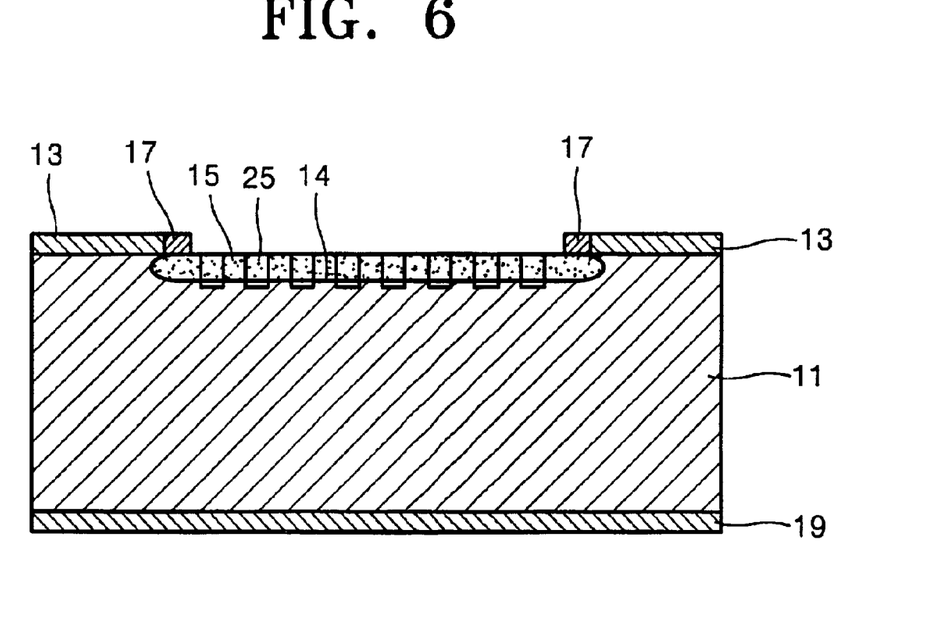
FIG. 6 is a sectional view of an embodiment of the silicon optoelectronic device according to the present invention to reduce the absorption of light travelling not perpendicular to the surface of the device and thus enhance light-emitting efficiency.
Figure 7:
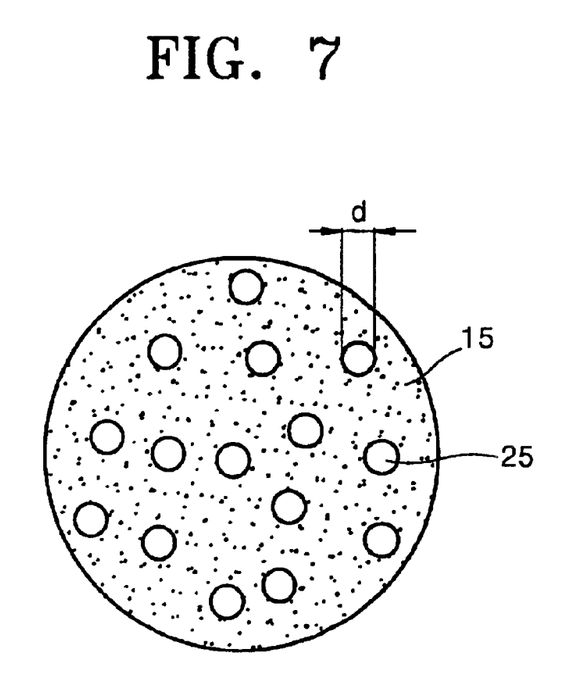
FIG. 7 is a partial plan view of a doped region of FIG. 6.

An embodiment of the silicon optoelectronic device according to the present invention to reduce the absorption of light travelling not perpendicular to the surface of the device and thus enhance light-emitting efficiency is shown in FIG. 6. FIG. 7 is a partial plan view of the doped region 15 of FIG. 6. In FIG. 6, the same reference numerals as in FIG. 3 denote the elements having the same functions as those in FIG. 3. Thus, the related descriptions above can be referred to and are not repeated here.

Referring to FIGS. 6 and 7, the embodiment of the silicon optoelectronic device according to the present invention includes a micro-hole 25 in the surface of the doped region 15 to externally emit a portion of the light that normally would be absorbed inside the device and thus enhance the output power of the light generated therein. Preferably, the micro-hole 25 extends down to a light-emitting portion in the p-n junction 14.

The micro-hole 25 may remain empty to be filled with air or a material incapable of absorbing a particular wavelength of light.

To amplify a particular wavelength of light, the size of the micro-hole 25 is determined to be λ/(2n) or integer multiples of λ/(2n), where λ is the particular wavelength of the light, and n is the effective refractive index of the material or air medium to fill the micro-hole 25 with respect to the wavelength λ.

In the silicon optoelectronic device having the micro-hole 25 in the doped region 15, a portion of the light diverging in a direction not perpendicular to the surface of the device can be emitted out of the device through the micro-hole 25, thereby enhancing light-emitting efficiency. In addition, when the size of the micro-hole 25 is determined to meet the condition with respect to a particular wavelength of light described above, light of a particular wavelength is amplified.

As described above, the silicon optoelectronic device according to the present invention acts as a light-emitting device, so it can be applied to a light-emitting apparatus such as a display system or illumination system. The light-emitting apparatus includes at least one optoelectronic device according to the present invention.

Figure 8:
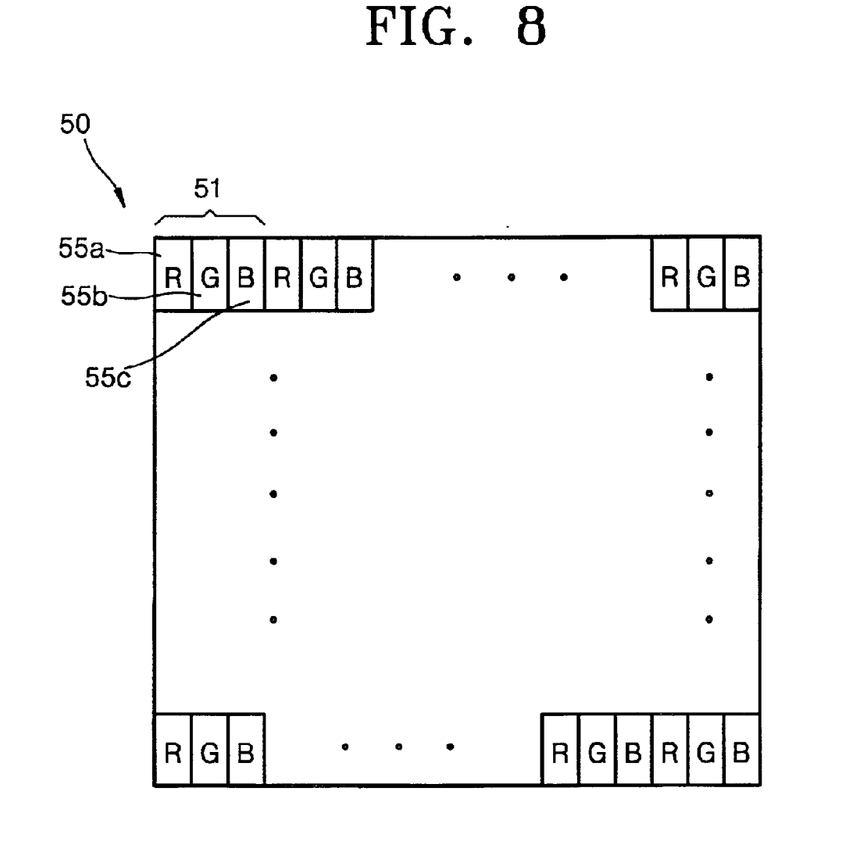
FIG. 8 is a plan view of an embodiment of a light-emitting apparatus employing the silicon optoelectronic device according to the present invention.
Figure 9:
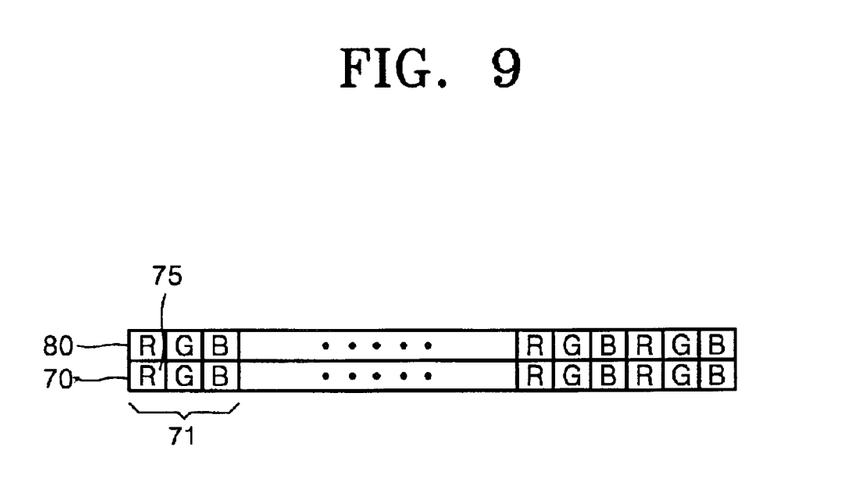
FIG. 9 is a plan view of another embodiment of the light-emitting apparatus employing the silicon optoelectronic device according to the present invention.

When the light-emitting apparatus employing the silicon optoelectronic device according to the present invention is for a display system, the silicon optoelectronic device according to the present invention may be arranged in a 2-dimensiononal array, as shown in FIGS. 8 and 9, to construct the light-emitting apparatus.

The optoelectronic device according to the present invention can be manufactured to be much smaller in size using a semiconductor material through the process applied to manufacture a semiconductor device. Thus, it is obvious that the optoelectronic device according to the present invention can be applied to a display system, especially a flat panel solid state display.

FIG. 8 shows a light-emitting apparatus capable of implementing RGB full-color display without using a color filter, in which three silicon optoelectronic devices 55a, 55b, and 55c according to the present invention to emit, for example, the colors R, G, and B, are arranged in each pixel 51. It is appreciated that an additional color filter could be installed in the light-emitting apparatus of FIG. 8 to realize much distinct color display.

FIG. 9 shows a light-emitting apparatus capable of implementing full-color display with a wavelength-selective color filter 80 displaced over the 2-dimensonal array 70 of the silicon optoelectronic devices 75 which emit white light. It is preferable that three silicon optoelectronic devices 75 according to the present invention which emit white light are arranged in each pixel 71, aligned with R, G, and B elements, respectively, of the color filter 80. At this time, the arrangement of the R, G, and B elements of the color filter 80 may be the same as or similar to the 2-dimensional array 50 of the silicon optoelectronic devices 55a, 55b, and 55c shown in FIG. 8.

The 2-dimensional array 50 of the silicon optoelectronic devices and/or the arrangement of the R, G, and B elements of the color filter 80 to realize full-color display can be varied in many different ways.

When the light-emitting apparatus employing the silicon optoelectronic device according to the present invention is an illumination system, at least one silicon optoelectronic device according to the present invention is used to construct the light-emitting apparatus, wherein the number of optoelectronic devices to be used is determined to comply with the use of the illumination system and the illuminance requirement thereto.

The above-description of the light-emitting apparatus employing the silicon optoelectronic device according to the present invention is enough to infer the entire structure of the light-emitting apparatus, and thus a detailed description and illustration thereof will be omitted.

Meanwhile, the silicon optoelectronic device according to the present invention can be used as a light-receiving device as well as a light-emitting device, as described above. In contrast to the silicon optoelectronic device acting as a light-emitting device, in the case where the silicon optoelectronic device acts as a light-receiving device and is irradiated by light, electrons and holes that will obtain energy from the light incident through the doped region 15 and generate an electric current and then an electrical signal proportional to the amount of the light radiated are generated. As a result, the silicon optoelectronic device can act as a light-receiving device.

Figure 10:
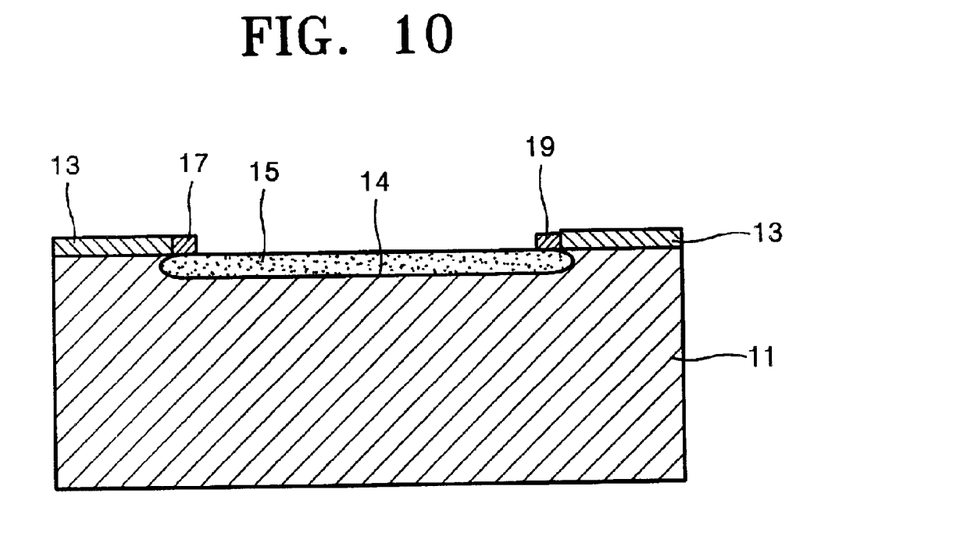
FIG. 10 is a sectional view of another embodiment of the silicon optoelectronic device according to the present invention acting as a light-receiving device.

When a voltage is vertically or laterally applied to a silicon optoelectronic device according to the present invention, a sub-energy bandgap in the quantum well formed at the p-n junction 14 can be sufficiently increased, so that the silicon optoelectronic device according to the present invention can be used as a UV detector. In the silicon optoelectronic device shown in FIG. 3 having a structure in which the second electrode 19 is formed on the bottom of the substrate 11, a voltage can be vertically applied across the first and second electrodes 17 and 19. Unlike the structure of the silicon optoelectronic device of FIG. 3, in the silicon optoelectronic device of FIG. 10, instead of forming the second electrode on the bottom of the substrate 11, the first and second electrodes 17 and 19 are both formed on the surface of the substrate 11 where the doped region 15 has been formed, such that a voltage can be horizontally applied to the device. In FIG. 10, the same reference numerals as in FIG. 3 denote the elements having the same or similar function as those in FIG. 3, and descriptions thereof will not be provided here.

UV rays refer to electromagnetic waves having a wavelength ranging from 400 nm to 1 nm (1 keV) within which range "near UV" refers to light of a wavelength over 300 nm and "vacuum UV" refers to light of a wavelength below 200 nm.

The following detectors are commonly used to detect UV rays.

To detect near UV or light of a wavelength longer than 100 nm, detectors for use to detect visible light, such as photodiodes, phototubes, and photomultiplier tubes, are modified to detect UV rays. A radioactive ray detector is used with respect to the wavelength range near X rays.

A silicon photodiode is used as a near-UV detector. The light absorbency of silicon increases as the wavelength of incident light becomes shorter. Accordingly, UV rays are absorbed only at the surface of the detector. Therefore, there is a need to reduce the junction to increase the sensitivity of the UV detector. Generally, silicon detectors are sensitive to light in the range of 200–1100 nm.

In a common detector with a doped region formed using a well known general doping technique, light is absorbed and scatters at the $p^+$(or $n^+$)-doped layer so that it cannot form electron-hole pairs that are vertically extracted through electrodes and contribute to an electrical response. The common detector having the doped region has an indirect bandgap structure to detect only light absorbed by the depletion region underneath the doped region as a current signal, without quantum effect. This indirect bandgap structure reduces the sensitivity of the detector and UV detection efficiency.

Figure 11:
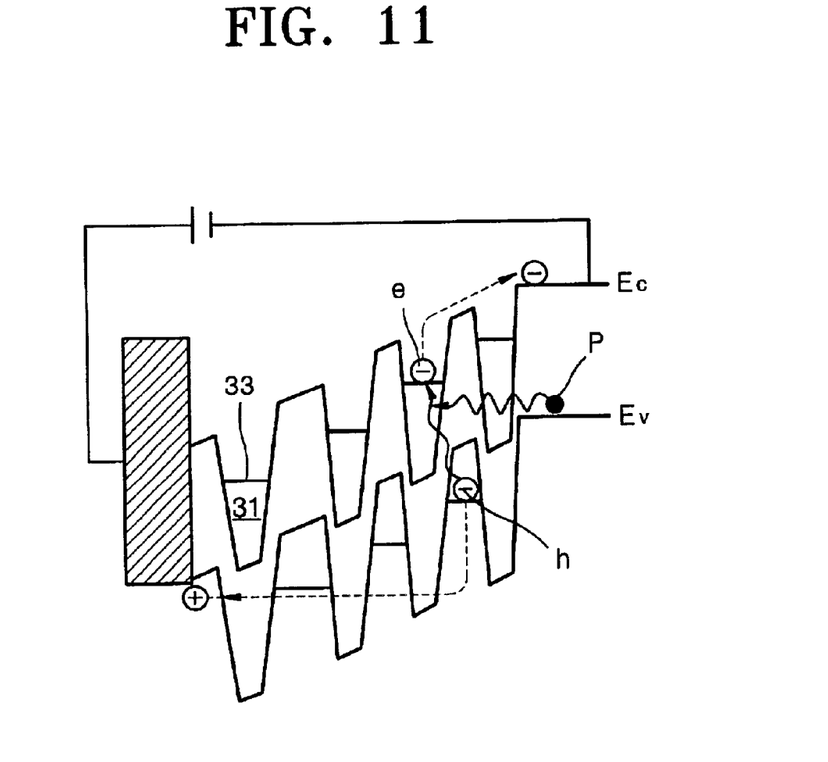
FIG. 11 illustrates the principle to detect UV rays in the energy band of a quantum well of the silicon optoelectronic device according to the present invention when used as a UV detector.

Meanwhile, in the silicon optoelectronic device according to the present invention, quantum effect occurs at the ultrashallow doped region 15 due to external voltage and localized variations in charge distribution potential. Also, as an external voltage is applied, a sub-energy band is formed in the quantum well, as shown in FIG. 11. As a result, the doped region 15 comes to have an energy bandgap which is wide enough to absorb high-energy UV rays, and the spectrum of the absorption coefficient is changed so that UV rays can be detected with high efficiency. In FIG. 11, reference numeral 31 denotes the quantum well, and reference numeral 33 denotes the sub-energy band. Also, "e" denotes an electron, "h" denotes a hole, and "p" denotes a photon. Ev denotes the valance band energy level, and Ec denotes the conduction band energy level.

The silicon optoelectronic device according to the present invention, which has the ultra-shallow doped region 15, is highly sensitive to light of a wavelength of 200–1100 nm. Also, the sub-energy bandgap in the quantum well is larger than the bandgap of silicon, so that UV of a very short wavelength no longer than 200 nm can be detected.

A problem with using an UV detector is that UV rays are non-transparent with respect to most materials. Generally, a silicon optoelectronic device is packaged with a transparent window which allows light to enter or exit from the silicon optoelectronic device. Glass ($SiO_2$) for use in forming the transparent window can transmit only UV of a wavelength no shorter than 150 nm.

Therefore, when the silicon optoelectronic device according to the present invention is used as a UV detector, it is preferable that the UV detector has a bared window structure where no glass window is formed to face a light incident side, so that UV of a wavelength no longer than 150 nm can be detected.

As described above, the silicon optoelectronic device according to the present invention has excellent efficiency and can be used as either a light-emitting device or a light-receiving device. Since the optoelectronic device according to the present invention uses silicon as a base material, it can be manufactured at low cost.

What is claimed is:

1. A silicon optoelectronic device comprising:
    a substrate based on an n-type or p-type silicon;
    a doped region formed on one surface of the substrate and doped to a depth with a predetermined dopant to be an opposite type from that of the substrate such that a photoelectrical conversion effect by quantum confinement occurs in a plurality of deformed areas, wherein said plurality of deformed areas constitute an undulated pattern; and
    first and second electrodes coupled to said substrate such that carriers are injected into a p-n junction in at least one of the deformed areas when a voltage is applied to said first and second electrodes.

2. The silicon optoelectronic device of claim 1, wherein the doped region is formed by non-equilibrium diffusion of the predetermined dopant.

3. The silicon optoelectronic device of claim 2, wherein the predetermined dopant comprises one of boron and phosphorous.

4. The silicon optoelectronic device of claim 1, wherein the predetermined dopant comprises one of boron and phosphorous.

5. The silicon optoelectronic device of claim 1, further comprising means for limiting the depth of the doped region such that the photoelectrical conversion effect by quantum confinement in said p-n junction disposed between the doped region and the substrate, occurs.

6. A silicon optoelectronic device comprising:
    a substrate based on an n-type or p-type silicon;
    a doped region formed on one surface of the substrate and doped to a depth with a predetermined dopant to be an opposite type from that of the substrate such that a photoelectrical conversion effect by quantum confinement occurs in a plurality of deformed areas, wherein said plurality of deformed areas constitute an undulated pattern; and
    first and second electrodes formed on the substrate to be electrically connected to the doped region, further comprising a control layer disposed on one surface of the substrate to limit the depth of the doped region, the depth being such that a photoelectrical conversion effect by quantum confinement in a p-n junction in at least one of the deformed areas between the doped region and the substrate occurs, and a quantum well, wherein electron-hole pairs are generated and annihilated, is formed in the p-n junction in at least one of the deformed areas between the doped region and the substrate.

7. The silicon optoelectronic device of claim 6, wherein the control layer is a silicon oxide layer, wherein a thickness of the silicon oxide layer is such that the doped region is formed to the depth such that a photoelectrical conversion effect by quantum confinement in the p-n junction between the doped region and the substrate occurs.

8. A silicon optoelectronic device comprising:

a substrate based on an n-type or p-type silicon;

a doped region formed on one surface of the substrate and doped to a depth with a predetermined dopant to be an opposite type from that of the substrate such that a photoelectrical conversion effect by quantum confinement occurs in a plurality of deformed areas, wherein said plurality of deformed areas constitute an undulated pattern; and first and second electrodes formed on the substrate to be electrically connected to the doped region, wherein a quantum well, where electron-hole pairs are generated and annihilated, is formed in a p-n junction in at least one of the deformed areas between the doped region and the substrate.

9. The silicon optoelectronic device of claim 8, wherein as a current is applied across the first and second electrodes, electron-hole pair annihilation occurs in said quantum well to emit light, so that the silicon optoelectronic device is operative as a light-emitting device.

10. The silicon optoelectronic device of claim 9, further comprising a plurality of micro-holes in the doped region to enhance the output power of generated light.

11. The silicon optoelectronic device of claim 10, wherein the plurality of micro-holes extend down to a light-emitting region in the p-n junction.

12. The silicon optoelectronic device of claim 10, wherein, in order to amplify a particular wavelength of generated light, the plurality of micro-holes have a diameter of $\ddot{y}/(2n)$ or integer multiples of $\ddot{y}/(2n)$, where $\ddot{y}$ is the particular wavelength of generated light, and n is a refractive index of a medium which fills the plurality of micro-holes.

13. The silicon optoelectronic device of claim 10, wherein the plurality of micro-holes are filled with a material incapable of absorbing a wavelength of emitted light.

14. The silicon optoelectronic device of claim 10, wherein the plurality of micro-holes are filled with air.

15. The silicon optoelectronic device of claim 8, wherein light incident through the doped region is absorbed in the quantum well formed in the p-n junction to generate the electron-hole pairs, so that the silicon optoelectronic device is available as a light-receiving device.

16. The silicon optoelectronic device of claim 15, wherein the quantum well has a sub-energy bandgap such that ultra-violet (UV) light is absorbed in the doped region, thereby causing an electric current to be generated indicating detection of UV light.

17. The silicon optoelectronic device of claim 16, wherein a range of the UV light is no longer than 150 nm.

18. The silicon optoelectronic device of claim 16, wherein the first electrode is formed on one surface of the substrate where the doped region is formed, and the second electrode is formed on another surface of the substrate.

19. The silicon optoelectronic device of claim 16, wherein the first and second electrodes are both formed on one surface of the substrate to be electrically connected to the doped region.

20. A silicon optoelectronic device comprising:

a substrate;

a doped region formed on one surface of the substrate and doped to a depth with a predetermined dopant to be an opposite type from that of the substrate such that a photoelectrical conversion effect by quantum confinement occurs in a plurality of deformed areas, wherein said plurality of deformed areas constitute an undulated pattern; and first and second electrodes coupled to said substrate such that carriers are injected into a p-n junction in at least one of the deformed areas when a voltage is applied to said first and second electrodes, wherein the substrate is formed of one selected from the group consisting of silicon, silicon carbide, and diamond.

21. A light-emitting apparatus comprising at least one silicon optoelectronic device acting as a light-emitting device, the silicon optoelectronic device including:

a substrate based on an n-type or p-type silicon;

first and second electrodes disposed on the substrate; and a doped region electrically connected to said first and second electrodes, the doped region being disposed on one surface of the substrate and doped to a depth with a predetermined dopant to be an opposite type from that of the substrate, the depth being such that a photoelectrical conversion effect by quantum confinement occurs in a plurality of deformed areas and the depth being such that, when a current is applied across the first and second electrodes, light is emitted from said doped region, wherein said plurality of deformed areas constitute an undulated pattern.

22. The light-emitting apparatus of claim 21, wherein the silicon optoelectronic device further comprises a control layer disposed to limit the depth of the doped region, and the depth being such that, when the current is applied across the first and second electrodes, light is emitted from said doped region.

23. The light-emitting apparatus of claim 21, wherein as the current is applied across the first and second electrodes of the silicon optoelectronic device, electron-hole pair annihilation occurs in a p-n junction between the doped region and the substrate to emit light, and the light-emitting apparatus is used as a display system comprising a plurality of silicon optoelectronic devices arranged in a two-dimensional array.

24. The light-emitting apparatus of claim 23, wherein the two-dimensional array comprises three silicon optoelectronic devices arranged in each pixel, so that the light-emitting apparatus emits light of different colors.

25. The light-emitting apparatus of claim 21, wherein as the current is applied across the first and second electrodes of the silicon optoelectronic device, electron-hole pair annihilation occurs in a p-n junction between the doped region and the substrate to emit light, and the light-emitting apparatus is used as an illumination apparatus comprising at least one silicon optoelectronic device.

26. The light-emitting apparatus of claim 21, wherein the silicon optoelectronic device further comprises means for limiting the depth of the doped region such that, when the current is applied across the first and second electrodes, light is emitted from said doped region.

27. A light-emitting apparatus comprising at least one silicon optoelectronic device acting as a light-emitting device, the silicon optoelectronic device including:

a substrate based on an n-type or p-type silicon;

first and second electrodes disposed on the substrate; and a doped region electrically connected to said first and second electrodes, the doped region being disposed on one surface of the substrate and doped to a depth with a predetermined dopant to be an opposite type from that of the substrate, such that a photoelectrical conversion effect by quantum confinement in a p-n junction between the doped region and the substrate occurs and such that, when a current is applied across the first and second electrodes, light is emitted from said doped region, wherein as the current is applied across the first and second electrodes of the silicon optoelectronic device, electron-hole pair annihilation occurs in the p-n junction between the doped region and the substrate to emit light, and the light-emitting apparatus is used as a display system comprising a plurality of silicon optoelectronic devices arranged in a two-dimensional array, wherein the two-dimensional array comprises three silicon optoelectronic devices arranged in each pixel, so that the light-emitting apparatus emits light of different colors, and wherein the three silicon optoelectronic devices emit white light, and the light-emitting apparatus comprises a dichroic color filter on a front surface of the two-dimensional array of the silicon optoelectronic devices.

28. A silicon optoelectronic device comprising:

a substrate based on an n-type or p-type silicon;

a doped region formed on one surface of the substrate and doped to a depth with a predetermined dopant to be an opposite type from that of the substrate such that a photoelectrical conversion effect by quantum confinement occurs in a plurality of deformed areas having a p-n junction between the doped region and the substrate;

first and second electrodes formed on the substrate to be electrically connected to the doped region, wherein the doped region has a depth of 10–20 nm; and wherein said plurality of deformed areas constitute an undulated pattern.

29. A light-emitting apparatus comprising at least one silicon optoelectronic device acting as a light-emitting device, the silicon optoelectronic device including:

a substrate based on an n-type or p-type silicon;

first and second electrodes disposed on the substrate; and a doped region electrically connected to said first and second electrodes, the doped region being disposed on one surface of the substrate and doped to a depth with a predetermined dopant to be an opposite type from that of the substrate, the depth being such that a photoelectrical conversion effect by quantum confinement occurs in a plurality of deformed areas having in a p-n junction between the doped region and the substrate, and the depth being such that, when a current is applied across the first and second electrodes, light is emitted from said doped region; and a plurality of micro-holes in the doped region to enhance the output power of generated light; wherein said plurality of deformed areas constitute an undulated pattern.

* * * * *